United States Patent
Takahashi et al.

(10) Patent No.: US 8,742,779 B2
(45) Date of Patent: Jun. 3, 2014

(54) SEMICONDUCTOR DEVICE AND ABNORMALITY PREDICTION METHOD THEREOF

(75) Inventors: Atsushi Takahashi, Kawasaki (JP); Hiroyuki Kii, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 978 days.

(21) Appl. No.: 12/789,933

(22) Filed: May 28, 2010

(65) Prior Publication Data
US 2010/0308867 A1  Dec. 9, 2010

(30) Foreign Application Priority Data
Jun. 5, 2009  (JP) .................................. 2009-136499

(51) Int. Cl.
*G01R 31/3187* (2006.01)

(52) U.S. Cl.
USPC .................... 324/750.3; 324/762.01; 714/718; 714/724; 714/733; 714/734

(58) Field of Classification Search
USPC ............ 324/750.3, 762.01–762.06; 714/718, 714/724, 733–734
See application file for complete search history.

(56) References Cited

U.S. PATENT DOCUMENTS

| | | | |
|---|---|---|---|
| 6,009,028 A * | 12/1999 | Akiyama ...................... | 365/201 |
| 6,396,321 B1 | 5/2002 | Watanabe et al. | |
| 7,205,854 B2 * | 4/2007 | Liu .................................. | 331/57 |
| 7,271,608 B1 * | 9/2007 | Vermeire et al. ........... | 324/750.3 |
| 7,339,389 B2 | 3/2008 | Mochizuki | |
| 7,650,552 B2 * | 1/2010 | Pourbigharaz et al. ....... | 714/733 |
| 8,028,211 B1 * | 9/2011 | Miller et al. .................. | 714/733 |
| 8,069,386 B2 * | 11/2011 | Higashino ..................... | 714/733 |
| 2002/0144177 A1 * | 10/2002 | Kondo et al. .................. | 714/13 |
| 2005/0212550 A1 | 9/2005 | Mochizuki | |
| 2006/0223201 A1 * | 10/2006 | Liu et al. ........................ | 438/10 |
| 2009/0115468 A1 | 5/2009 | Berthold et al. | |

FOREIGN PATENT DOCUMENTS

| | | |
|---|---|---|
| JP | 2009-512200 A | 3/2000 |
| JP | 2000-243910 A | 9/2000 |
| JP | 2005-277087 A | 10/2005 |

OTHER PUBLICATIONS

Japanese Office Action issued Sep. 3, 2013 in corresponding Japanese Patent Application No. 2009-136499.

* cited by examiner

*Primary Examiner* — Patrick Assouad
*Assistant Examiner* — Alexander J Nemtzow
(74) *Attorney, Agent, or Firm* — Sughrue Mion, PLLC

(57) ABSTRACT

A semiconductor device includes a first CPU, a second CPU having a configuration that is the same as or comparable to a configuration of the first CPU, and a comparator that compares an output of the first CPU with an output of the second CPU. The second CPU is made so as to have a lower operating margin than the first CPU. By supplying a same signal to the first CPU and the second CPU and then detecting a mismatch between the outputs of the first CPU and the second CPU as a result of comparison, the abnormality is predicted. The semiconductor device includes a reset control circuit that resets the device when the result of comparison by the comparator indicates an error.

4 Claims, 5 Drawing Sheets

SEMICONDUCTOR DEVICE AND ABNORMALITY PREDICTION METHOD THEREOF

CROSS-REFERENCE TO RELATED APPLICATION

This application is based upon and claims the benefit of the priority of Japanese patent application No. 2009-136499 filed on Jun. 5, 2009, the disclosure of which is incorporated herein in its entirety by reference thereto.

TECHNICAL FIELD

The present invention relates to a semiconductor device. More specifically, the present invention relates to a semiconductor device and a method by which an abnormal operation can be predicted in advance.

BACKGROUND

Operation characteristics of semiconductor devices vary due to a change in an environment of use, an aging change, or the like such as supply voltage or temperature. For this reason, the following countermeasure is needed. That is, an abnormal operation caused by use of a semiconductor device at a temperature beyond an operation guarantee temperature range or the like is detected in advance. Then, operation of the device is changed according to a location (failure location) at which the abnormal operation has occurred. In related art semiconductor devices which do not include a function of identifying a failure location, operation at a time of failure cannot be changed according to the failure location.

As a configuration for allowing detection of an integrated circuit device that is about to be broken before occurrence of a failure, Patent Document 1 discloses a configuration including an evaluation circuit in a semiconductor integrated circuit device. The evaluation circuit is provided independent of a main body circuit that achieves a primary function. A clock signal having a frequency higher than a clock signal for operating the main body circuit is supplied to the evaluation circuit for operation. In Patent Document 1, the evaluation circuit is operated at the clock frequency higher than the clock frequency for the main body circuit. Thus, the evaluation circuit that operates at the higher clock frequency deteriorates earlier than the main body circuit. This deterioration normally appears in the form of a delay of an output signal of the evaluation circuit. Then, by providing a deterioration detection unit that detects this delay, the deterioration of the evaluation circuit is detected.

[Patent Document 1] JP Patent Kokai Publication No. JP-P2005-277087A

SUMMARY

The entire disclosure of the above patent document is incorporated herein by reference thereto. The following analysis of the related art is given by the present invention.

The above-mentioned configuration of Patent Document 1 uses a test circuit (evaluation circuit) aside from the circuit targeted for test. Thus, though detection of deterioration of an entire product is possible in advance, it cannot be identified which portion of the product actually is in failure. That is, the deterioration of the evaluation circuit which is independent of the main body circuit is just detected. For this reason, the operation of the device cannot be changed, corresponding to the failure portion of the main body circuit that achieves the primary function.

Accordingly, it is an object of the present invention to provide a semiconductor device and an abnormality prediction method by which information that a failure is likely to occur can be obtained, and an operation can be changed according to a location where occurrence of the failure has been predicted.

According to the present invention, there is provided a semiconductor device comprising:

a first circuit;

a second circuit having a configuration that is the same as or comparable to a configuration of the first circuit, the second circuit having an operating margin that is different from an operating margin of the first circuit;

a comparator that compares an output of the first circuit with a corresponding output of the second circuit; and a control circuit that, when the comparator detects a mismatch between the outputs of the first and second circuits to which a same signal has been applied, carries out a predetermined operation in correspondence with the detection of the mismatch.

According to the present invention, there is provided an abnormality prediction method comprising:

preparing a second circuit for a first circuit, the second circuit having a configuration that is the same as or comparable to a configuration of the first circuit, the second circuit having an operating margin that is different from an operating margin of the first circuit;

applying a same signal to the first circuit and the second circuit and comparing by an comparator an output of the first circuit with an output of the second circuit; and predicting an operation abnormality, when a mismatch between the outputs of the first and second circuits is detected by the comparator to carry out a predetermined operation.

According to the present invention, information that a failure is likely to occur can be obtained before the failure actually occurs, and operation can be changed according to a location where an occurrence of the failure has been predicted.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED MODES

Figure 1:
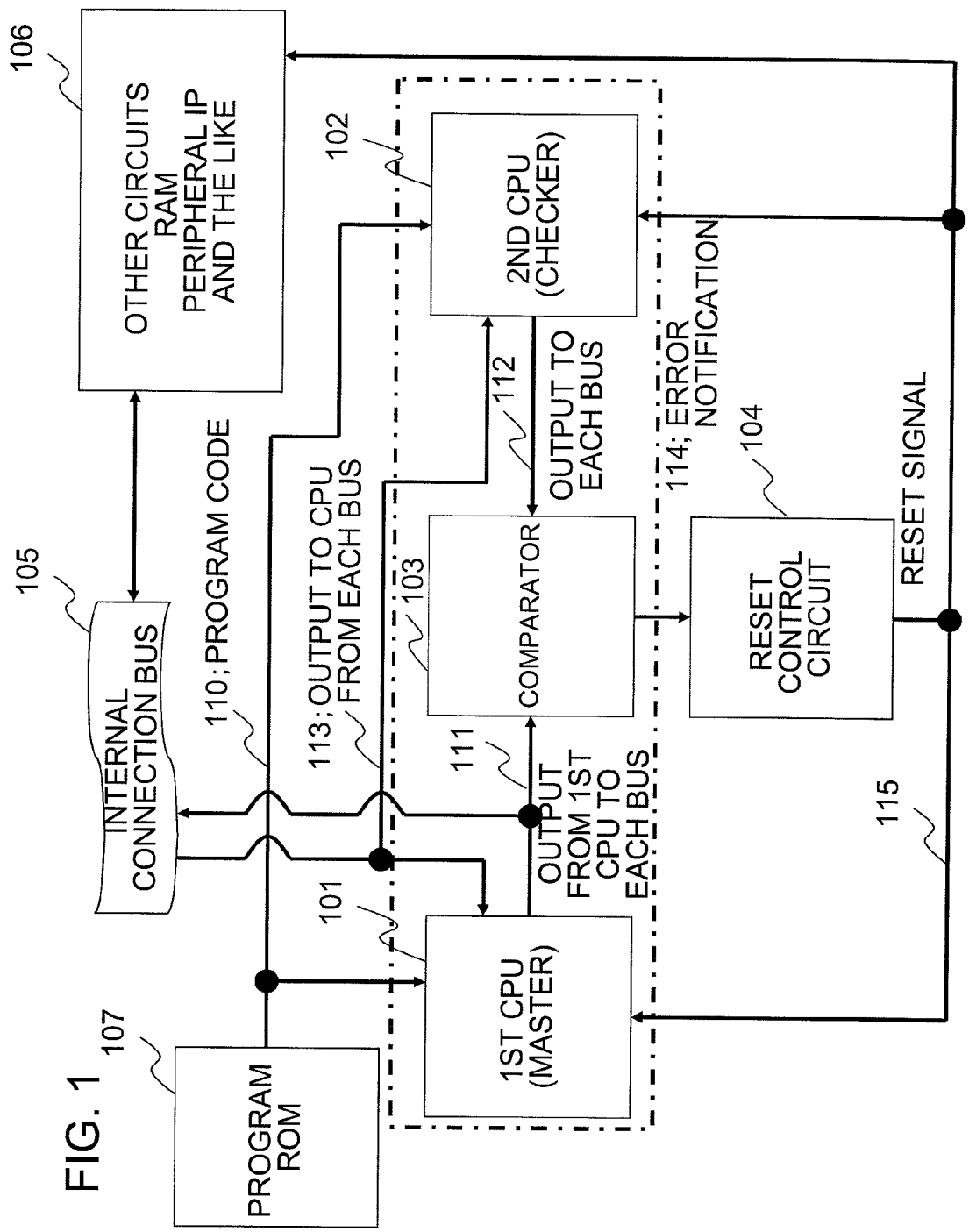
FIG. 1 is a diagram showing a configuration of a first exemplary embodiment of the present invention.

A semiconductor device according to the present invention includes a first circuit (such as a first CPU (master) 101 in FIG. 1), a second circuit (such as a second CPU (checker) 102 in FIG. 1), and a comparator (indicated by reference numeral 103 in FIG. 1, for example). The second circuit has a configuration that is the same as or comparable to a configuration of the first circuit, and has an operating margin that is different from an operating the first circuit. The comparator compares an output of the first circuit with an output of the second circuit. When a same signal is applied to the first and second circuits and a mismatch is detected between the outputs of the first and second circuits corresponding to the input signal, a predetermined operation (for example, a reset operation by a reset control circuit 104 in FIG. 1) is performed in correspondence with detection of the mismatch. In the present invention, the second circuit (such as the second CPU in FIG. 1) is made in advance, for example, at a time of fabrication thereof, so as to have an operating margin lower than an operating margin of the first circuit (such as the first CPU in FIG. 1). The second circuit may be configured to operate abnormally before operates abnormally, under the same operating environment, such as operating speed, supply voltage, or operating temperature. With this arrangement, information that a failure is likely to occur in the first circuit can be detected before the failure actually occurs in the first circuit. According to a portion where an occurrence of the failure has been predicted (such as a specific signal of the first circuit), an operation can be changed to be different from that which has been executed so far. Description will be given below in connection with exemplary embodiments.

FIG. 1 is a diagram showing a configuration of a semiconductor device according to a first exemplary embodiment of the present invention. Referring to FIG. 1, this semiconductor device includes a first CPU (first CPU) 101, a second CPU (second CPU) 102, a comparator 103, a reset (Reset) control circuit 104, an internal connection bus 105, other circuits 106, and a program ROM (Read Only Memory) 107.

The first CPU 101 is a CPU for executing a program. The first CPU is also referred to as a master (or a master CPU), and performs control over the other circuits 106, according to an execution result of the first CPU 101.

The second CPU 102 is a CPU for operation check, and is also referred to as a checker (or a checker CPU). The second CPU 102 has a circuit configuration that is the same as or comparable to a circuit configuration of the first CPU 101. The second CPU 102 is so made that an operating margin (margin for operating temperature, supply voltage, or operation timing) thereof is smaller (narrower) than an operating margin of the first CPU 101.

The first CPU 101 and the second CPU 102 are driven by a common clock signal not shown, and execute a same program code (same instruction) at a same timing. In this exemplary embodiment, an execution result of the second CPU 102 is used for comparison with an operation result of the first CPU 101.

A program code (instruction code) is stored in the program ROM 107. The first CPU 101 issues a read access request to the program ROM 107. A program code 110 read from the program ROM 107 is supplied to the first CPU 101 and the second CPU 102 in a same cycle and executed (synchronously executed).

The internal connection bus 105 is an internal bus for connecting the first CPU 101 and the other circuits 106 controlled by the first CPU 101. An output (address, data, or control signal) from the first CPU 101 is transferred to the other circuits 106 through the internal connection bus 105.

An output from the other circuits 106 (such as a response to a request from the first CPU 101 or the like or an interrupt request for the first CPU 101) is transferred through the internal connection bus 105. An output 113 from each bus to the CPUs is supplied in common to the first CPU 101 and the second CPU 102.

The other circuits 106 are circuits controlled through a bus 111 and the bus 105 according to a result of execution of the program code by the first CPU 101. Though not limited thereto, the other circuits 106 include a RAM (Random Access Memory) in which data is stored, a peripheral IP (Intellectual Property), and the like.

An output 111 of the first CPU 101 to each bus and an output 112 of the second CPU 102 to each bus are supplied to the comparator 103.

When the comparator 103 detects that the output 111 from the first CPU 101 to each bus and the output 112 from the second CPU 102 to each bus do not match, the comparator 103 supplies an error notification 114 to the reset control circuit 104. The comparator 103 in this exemplary embodiment includes an address comparator, a data comparator, and a control signal comparator (all of which are not shown). The address comparator compares an address signal output from the first CPU 101 to each bus with an address signal output from the second CPU 102 to each bus. The data comparator compares a data signal output from the first CPU 101 to each bus with a data signal output from the second CPU 102 to each bus. The control signal comparator compares a control signal output from the first CPU 101 to each bus with a control signal output from the second CPU 102 to each bus. When there is even one mismatch as a result of a logical operation (such as an OR operation) on these outputs by the comparator, the error notification 114 may be output. Further, when the comparator 103 compares the output 111 from the first CPU 101 to each bus with the output 112 from the second CPU 102 to each bus on a clock cycle basis, a latch circuit (not shown) may be included. The latch circuit latches a result of comparison by a digital comparison circuit (not shown) until a next clock cycle, according to a latch timing signal generated based on the digital comparison circuit and a clock signal.

When the reset control circuit 104 receives the error notification 114 output from the comparator 103 (or when there is a mismatch as a result of comparison by the comparator 103), an entire product, for example, is forcibly reset. In the example shown in FIG. 1, the reset control circuit 104, which has received the error notification 114, supplies a reset signal 115 to the first CPU 101, second CPU 102, and other circuits 106. Though not limited thereto, the reset signal 115 from the reset control circuit 104 may be supplied to the first CPU 101 and the second CPU 102 as a reset interrupt signal. In this case, when the reset signal 115 from the reset control circuit 104 is activated, each of the first CPU 101 and the second CPU 102 executes a halt instruction (Halt) or executes a shutdown process, as an interrupt process for activation of the reset signal 115, for example. When the reset signal 115 from the reset control circuit 104 is activated, the other circuits 106 execute a reset operation such as an operation stop.

The second CPU 102 and the first CPU 101 have a same configuration, and are driven by the same clock signal. However, operating margins of the first CPU 101 and the second CPU 102 (operating margins for timing, temperature, supply voltage, and the like) are different. The second CPU 102 is made so as to operate abnormally earlier than the first CPU 101 according to an operating environment such as operating speed, supply voltage, or operating temperature. For this reason, detection of a mismatch by the comparator 103 means an occurrence of a malfunction of the second CPU 102. When the malfunction of the second CPU 102 occurs, basically, the first CPU 101 performs a normal operation. That is, according to this exemplary embodiment, when the first CPU 101 actually malfunctions (fails) and before a critical error occurs, an operation that accommodates the failure can be executed.

In the configuration example in FIG. 1, the reset control circuit 104, responsive to the error notification 114 from the comparator 103, simultaneously resets the first CPU 101, second CPU 102, and other circuits 106. When a mismatch is detected by the comparator 103, the comparator 103 or the reset control circuit 104 may notify the malfunction of the second CPU 102 to the first CPU 101 in the form of an alarm.

The configuration shown in FIG. 1 illustrates an example of the semiconductor device to which the present invention has been applied. The present invention is not, of course, limited to such a configuration alone. The program code, for example, may be fetched from a RAM rather than the ROM. The semiconductor device may include an instruction cache or the like. Further, the other circuits 106 may include a memory other than the RAM, various input devices, an interface, and the like. FIG. 1 shows a configuration example where the first CPU 101, second CPU 102, program ROM 107, comparator 103, reset control circuit 104, other circuits 106, and the like are all integrated on one chip. A portion of these components such as the first CPU 101, second CPU 102, comparator 103, reset control circuit 104 may as a matter of course be implemented on one chip. Alternatively, the present invention can also be of course applied to a semiconductor device in which each chip of the first CPU 101 and the second chip 102 is implemented on a substrate.

Figure 2:
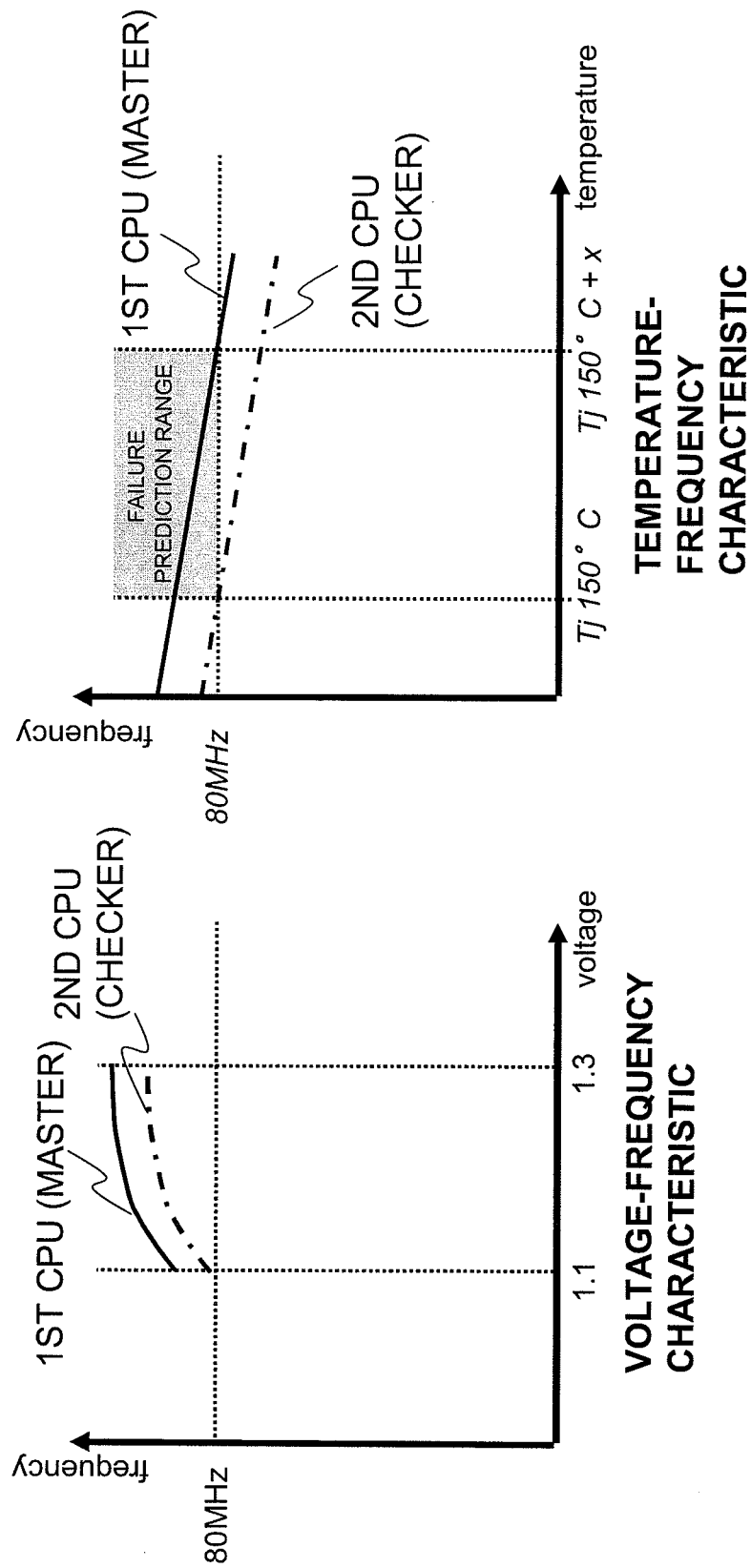
FIGS. 2A and 2B are graphs explaining an example of setting an operating margin in the first exemplary embodiment of the present invention.

FIGS. 2A and 2B are diagrams explaining setting of an operating margin in the present invention. FIG. 2A is a graph showing voltage-frequency characteristics of the first CPU (master) and the second CPU (checker) in FIG. 1. A horizontal axis indicates a power supply voltage, while a vertical axis indicates an operating frequency. In FIG. 2A, a solid line indicates the characteristic of the first CPU (master), while a dashed line indicates the characteristic of the second CPU (checker). FIG. 2B is a graph showing temperature-frequency characteristics of the first CPU (master) and the second CPU (checker) in FIG. 1. A horizontal axis indicates a temperature (Tj: junction temperature), while a vertical axis indicates the operating frequency. In FIG. 2B, a solid line indicates the characteristic of the first CPU (master), while a dashed line indicates the characteristic of the second CPU (checker).

Referring to FIG. 2A, a supply voltage range is 1.1V to 1.3V. In the example in FIG. 2A, it becomes difficult for the second CPU (checker) to operate (the second CPU malfunctions) at a supply voltage of 1.1V at an operating frequency of 80 MHz. On the other hand, the first CPU (master) operates (does not fail) even at the supply voltage 1.1V at an operating frequency of 80 MHz and more.

In the example in FIG. 2B, the first CPU (master) does not fail at a junction temperature Tj=150° C. even by being driven by a clock signal of a frequency of 80 MHz or more. At the junction temperature Tj=150° C. or higher, the second CPU (checker) does not operate unless driven by a clock signal of a frequency lower than 80 MHz (the second CPU does not operate at 80 MHz). At the junction temperature Tj=150° C.+x (where x>0), the first CPU (master) does not operate at 80 MHz. Accordingly, in this case, a failure prediction range is from the junction temperature Tj=150° C. to 150° C.+x for the operating frequency of 80 MHz. An error is detected by the comparator 103 in FIG. 1, and an operation that corresponds to the prediction of the failure is executed by the reset control circuit 104.

FIGS. 3A to 3C are diagrams that explain operation of the semiconductor device in the first exemplary embodiment, shown in FIG. 1. FIG. 3A is a timing diagram, and FIG. 3B is a graph showing an operation-frequency characteristic. Time in FIG. 3B corresponds to time in the timing diagram in FIG. 3A. Maximum operating temperatures (operation guarantee temperatures) of the first CPU 101 and the second CPU 102 are respectively set to 160° C. and 150° C. (each of which indicates the temperature Tj).

FIG. 3C is a table that illustrates execution program instructions and execution results (bus outputs) of each of the first CPU 101 and the second CPU 102. Each of the first CPU 101 and the second CPU 102 outputs execution results 1, 2, and 3 (in this case, data values) to instructions for programs A, B, and C, respectively.

Referring to FIG. 3A, each of the first CPU 101 and the second CPU 102 receives the program A at a timing 1, and outputs 1 as the bus output of the execution result of each of the first CPU 101 and the second CPU 102 at a timing 2. Then, at a timing 3, an error output of the comparator is set to 0.

After a timing 4, the operating temperature starts to rise. When the operating temperature (junction temperature Tj) exceeds 150° C., the operating temperature exceeds the maximum temperature operation of the second CPU 102. Thus, the second CPU 102 malfunctions. The first CPU 101 and the second CPU 102 receive a program C, and respectively output the execution results 3 and 2 as the bus outputs of the execution results. Then, the comparator 103 outputs the error (activates the error notification 114 in FIG. 1). Upon receipt of the error notification 114 from the comparator 103, the reset control circuit 104 activates the reset signal 115 to reset the device.

The semiconductor device is designed and manufactured so that the operating margin of the first CPU 101 is larger than the operating margin of the second CPU 102. Thus, the second CPU 102 abnormally operates earlier than the first CPU 101.

Figure 3:
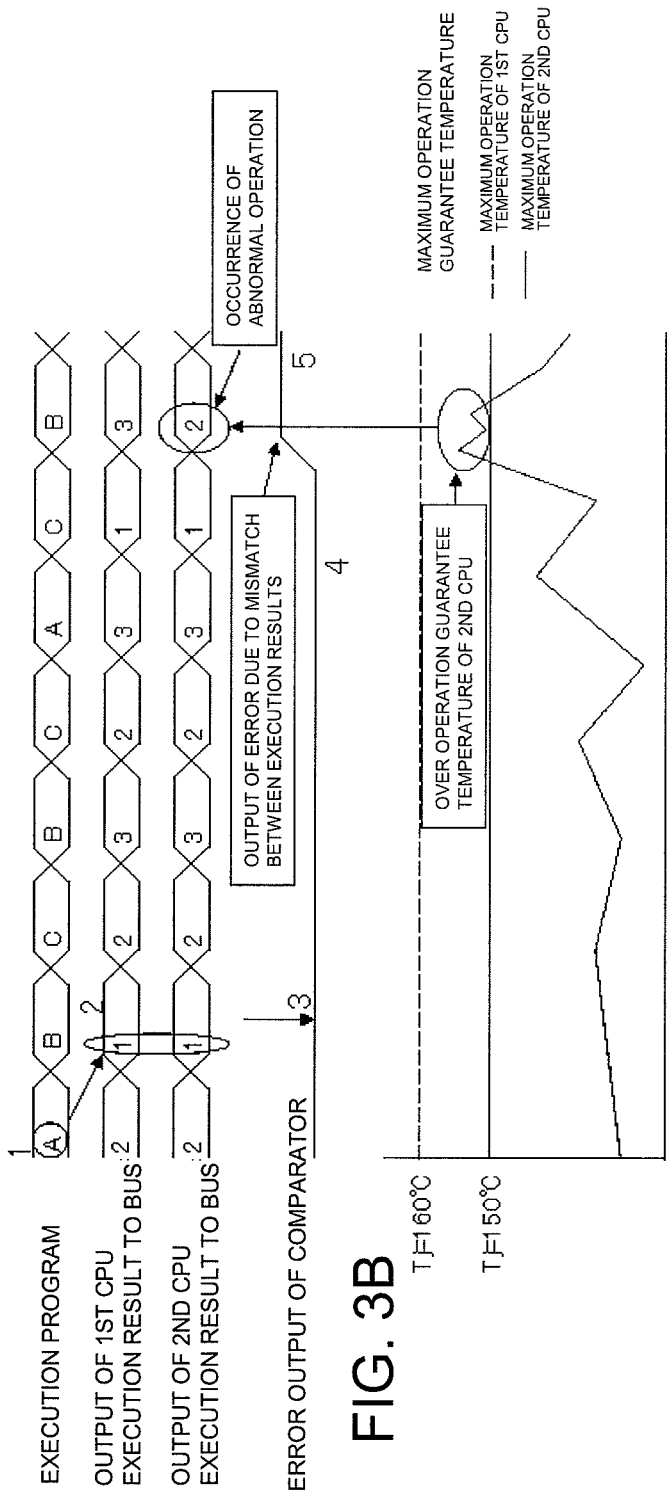
FIGS. 3A and 3B are timing diagrams explaining an operation of the first exemplary embodiment of the present invention.
FIG. 3C is a table explaining the operation of the first exemplary embodiment of the present invention.

In the example in FIG. 3, the maximum temperature operation (junction temperature Tj) of the second CPU 102 is set to 150° C. Thus, when the second CPU 102 malfunctions and the error notification 114 is output from the comparator 103, it is found that the junction temperature Tj has exceeded 150° C. In this case, the second CPU 102 and the comparator 103 may function as a junction temperature detection circuit (sensor) as well.

Figure 4:
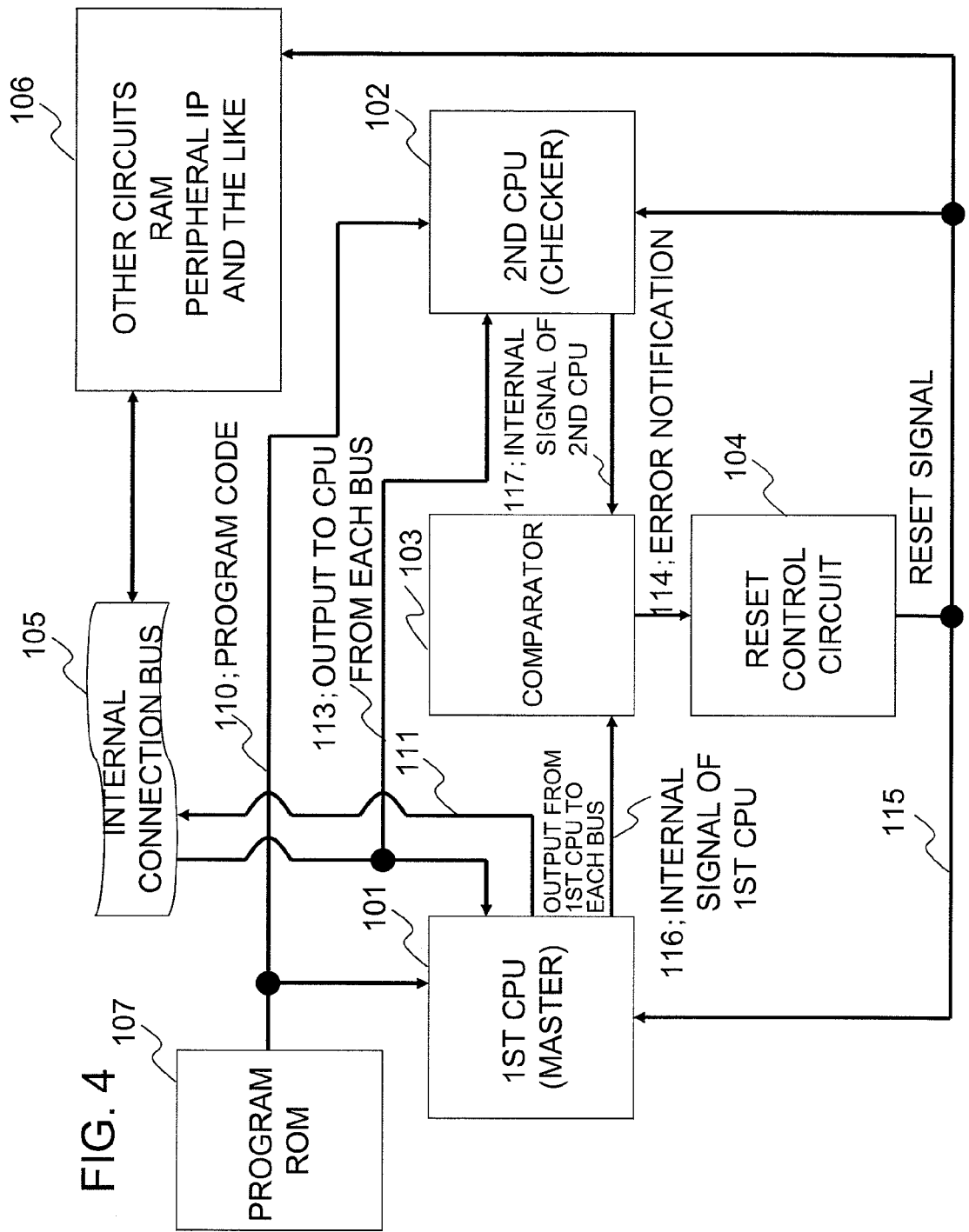
FIG. 4 is a diagram showing a configuration of a second exemplary embodiment of the present invention.

A second exemplary embodiment of the present invention will be described. FIG. 4 is a diagram showing a configuration of the second exemplary embodiment of the present invention. Referring to FIG. 4, a comparator 103 receives an internal signal of a first CPU 101 and an internal signal of a second CPU 102. When the internal signal of the first CPU 101 does not match the internal signal of the second CPU 102, the comparator 103 outputs an error notification 114.

In this exemplary embodiment, signals supplied to the comparator 103 include an internal signal output from the first CPU 101 to an outside and the corresponding internal signal of the second CPU 102, for comparison. In the first exemplary embodiment, since bus outputs are compared by the comparator 103, the bus in which the abnormality has occurred can be just identified, when an abnormality has occurred. In this exemplary embodiment, since internal states of the CPUs are compared by the comparator, the detection of a more detailed location of the failure is made possible. An arbitrary signal can be used as the internal signal of each CPU. In case where a CPU timing margin or the like becomes a problem, representative signals corresponding to critical paths inside the CPUs may be compared by the comparator 103.

Figure 5:
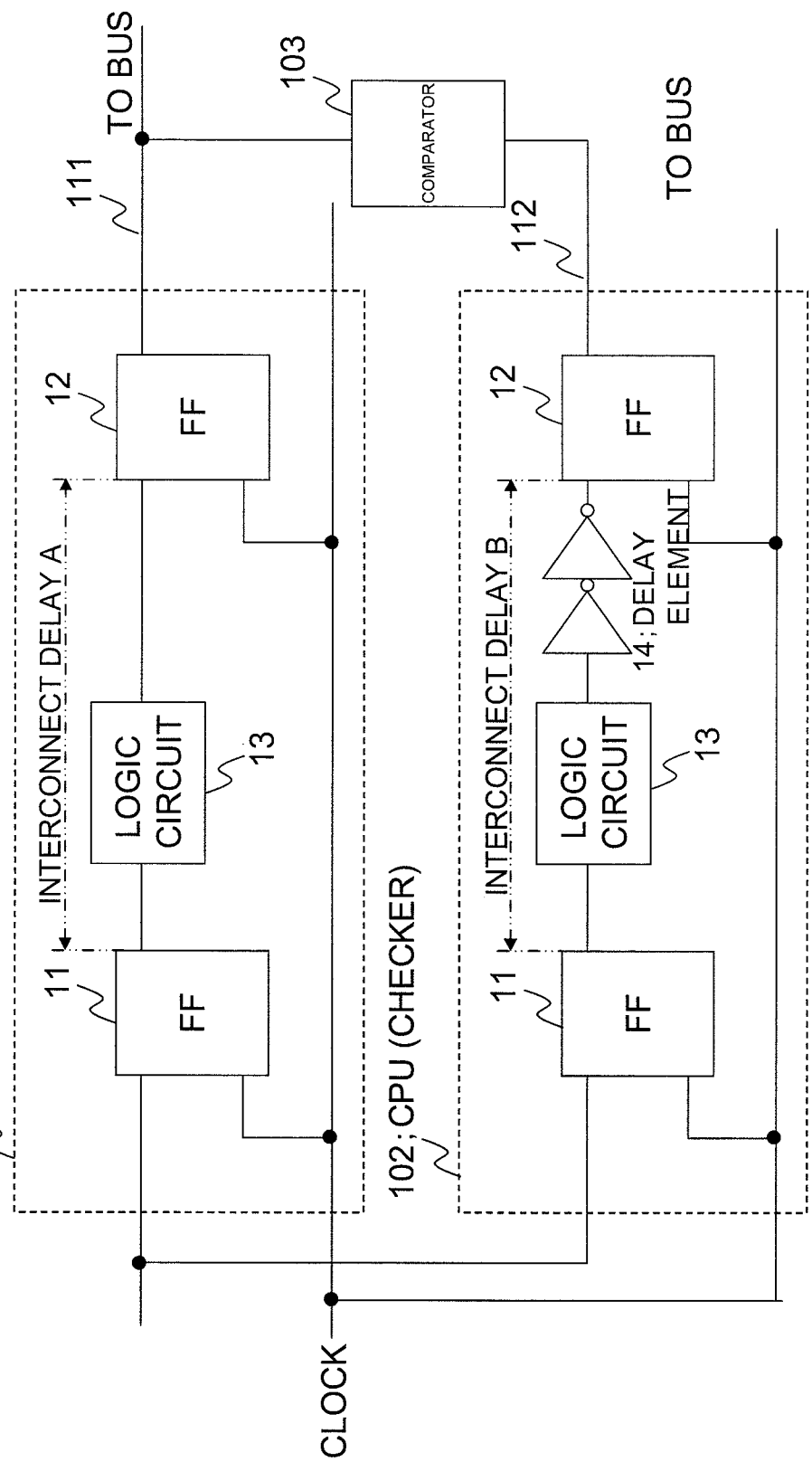
FIG. 5 is a diagram showing configurations of first and second CPUs in the first exemplary embodiment of the present invention.

FIG. 5 is a diagram showing configuration examples of the first CPU (master) 101 and the second CPU (checker) 102 in FIG. 1. The first CPU 101 includes a logic circuit (combinatorial circuit) 13 between an FF (flip-flop) 11 and an FF 12. An interconnect delay between the FF11 and the FF12 is indicated by reference character A. In the second CPU 102, the logic circuit (combinatorial) circuit 13 and a delay element (a plurality of inverters) 14 are provided between the FF11 and FF12. An interconnect delay between the FF11 and FF12 is indicated by reference character B. A data signal is supplied in common to the FFs 11 of the first CPU 101 and the second CPU 102. An output of the FF12 of the first CPU 101 is output to a bus 111, and is also supplied to the comparator 103. An output of the FF12 of the second CPU 102 is supplied to the comparator 103 through a bus 112. The FF11 of the first CPU 101 and the FF12 of the second CPU 102 are driven by a common clock.

Referring to FIG. 5, timing design is performed by inserting the delay element 14 or increasing an interconnect length so that a relationship of interconnect delay A<interconnect delay B<target interconnect delay holds. The operating frequency of the configuration in FIG. 5 is set to 80 MHz (where one clock cycle=12.5 ns). The interconnect delay A is set to 8 ns. The interconnect delay B is set to 10 ns. The target interconnect delay is set to 12 ns. Assume that the first CPU 101 and the second CPU 102 are operated by a clock signal of the frequency of 80 MHz in the configuration in FIG. 5. When a propagation delay time increases due to a reduction in supply voltage or the like, the second CPU (checker) 102 having a smaller timing margin malfunctions earlier than the first CPU (master) 101. Then, a mismatch is detected by the comparator 103.

In the above-mentioned exemplary embodiments, description was given about the configurations where two CPUs were disposed and outputs of the CPUs were compared. The circuits of which outputs are compared are not limited to the CPUs. The present invention may be of course applied to each of arbitrary circuit blocks within the semiconductor device. For each circuit block, a circuit block that is the same as or comparable to the circuit block and has a different operating margin is provided. Then, a comparator that compares outputs of the two circuit blocks is provided. In this case, the number of the circuit blocks of which outputs are compared by the comparator is not limited to two. Three or more circuit blocks of a same or comparable configuration may be of course compared.

According to the present invention, comparison of two of same or comparable circuits can be made about a circuit for detection. Then, according to granularity for the comparison, granularity for determining a failure location may be changed to be fine. For this reason, operation of the device at a time of an abnormal operation can be changed according to the failure location.

Disclosure of Patent Document listed above is incorporated herein by reference. Modifications and adjustments of the exemplary embodiments and an example are possible within the scope of the overall disclosure (including claims) of the present invention, and based on the basic technical concept of the invention. Various combinations and selections of various disclosed elements are possible within the scope of the claims of the present invention. That is, the present invention of course includes various variations and modifications that could be made by those skilled in the art according to the overall disclosure including the claims and the technical concept.

What is claimed is:

1. A semiconductor device comprising:
   a first circuit;
   a second circuit having a configuration that is the same as or comparable to a configuration of the first circuit, the second circuit having an operating margin that is different from an operating margin of the first circuit;
   a comparator that compares an output of the first circuit with a corresponding output of the second circuit; and
   a control circuit that, when the comparator detects a mismatch between the outputs of the first and second circuits to which a same signal has been applied, carries out a predetermined operation in correspondence with the detection of the mismatch,
   wherein the second circuit is made so as to have the operating margin that is lower than the operating margin of the first circuit, the second circuit falling into a failure before the first circuit falls into a failure, when the first and second circuits are operated under the same operating environment,
   wherein the control circuit includes a reset control circuit that receives a comparison result from comparison and resets the first and second circuits when the comparison indicates a mismatch,
   wherein the first circuit includes a first CPU, and the second circuit includes a second CPU, and
   wherein the semiconductor device comprises:
      first and second buses to which outputs of first and second CPUs are connected, respectively, the comparator receiving outputs of the first and second buses to which the first and second CPUs deliver respective outputs, for comparison.

2. The semiconductor device according to claim 1, wherein the comparator receives internal signals of the first and second CPUs, for comparison.

3. A method of predicting an operation abnormality, the method comprising:
   preparing a second circuit for a first circuit, the second circuit having a configuration that is the same as or comparable to a configuration of the first circuit, the second circuit having an operating margin that is different from an operating margin of the first circuit;
   applying a same signal to the first circuit and the second circuit and comparing by an comparator an output of the first circuit with an output of the second circuit;
   predicting an operation abnormality, when a mismatch between the outputs of the first and second circuits is detected by the comparator to carry out a predetermined operation,
   making the second circuit so as to have the operating margin that is lower than the operating margin of the first circuit, the second circuit falling into a failure before the first circuit falls into a failure, when the first and second circuits are operated under the same operating environment;
   resetting the first and second circuits when the mismatch between the outputs of the first and second circuits is detected by the comparator,
   wherein the first circuit includes a first CPU, and the second circuit includes a second CPU, and
   wherein the method further comprises:

receiving by the comparator outputs of the first and second buses to which the first and second CPUs delivers outputs, respectively, for comparison.

4. The method according to claim 3, the method further comprising:

receiving by the comparator internal signals of the first and second CPUs, for comparison.

* * * * *